(12) United States Patent
Degrenne et al.

(10) Patent No.: US 11,152,934 B2
(45) Date of Patent: Oct. 19, 2021

(54) DEVICE AND METHOD FOR CONTROLLING SWITCHING

(71) Applicant: MITSUBISHI ELECTRIC CORPORATION, Tokyo (JP)

(72) Inventors: Nicolas Degrenne, Rennes (FR); Stefan Mollov, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 343 days.

(21) Appl. No.: 16/325,093

(22) PCT Filed: Sep. 19, 2017

(86) PCT No.: PCT/JP2017/034401
§ 371 (c)(1),
(2) Date: Feb. 12, 2019

(87) PCT Pub. No.: WO2018/056421
PCT Pub. Date: Mar. 29, 2018

(65) Prior Publication Data
US 2021/0175883 A1  Jun. 10, 2021

(30) Foreign Application Priority Data
Sep. 20, 2016 (EP) ..................................... 16189716

(51) Int. Cl.
*H03B 1/00* (2006.01)
*H03K 3/00* (2006.01)
(Continued)

(52) U.S. Cl.
CPC ............ *H03K 17/165* (2013.01); *H02M 1/08* (2013.01); *H03K 17/168* (2013.01); *H03K 2217/0027* (2013.01)

(58) Field of Classification Search
CPC ............... H03K 17/165; H03K 17/168; H03K 2217/0027; H02M 1/08
See application file for complete search history.

(56) References Cited

U.S. PATENT DOCUMENTS

2004/0130923 A1  7/2004  Yin Ho et al.
2014/0192560 A1  7/2014  Ou et al.
(Continued)

FOREIGN PATENT DOCUMENTS

JP    2009-77513 A    4/2009

*Primary Examiner* — Metasebia T Retebo
(74) *Attorney, Agent, or Firm* — Birch, Stewart, Kolash & Birch LLP.

(57) ABSTRACT

The present invention concerns a device for controlling the switching of a first and a second power semiconductor switches providing current to a load in a half bridge configuration. The device comprises: means for obtaining a first current value through the first switch or the load just before the switching of the first switch from conducting to non-conducting state, means for limiting the current through the second switch during the switching of the second switch from non-conducting to conducting state using the obtained first current value, by modifying the gate signal of the second switch, means for obtaining a second current value through the second switch or the load just before the switching of the second switch from conducting to non-conducting state, means for limiting the current through the first switch during the switching of the first switch from non-conducting to conducting state using the obtained second current value by modifying the gate signal of the first switch.

9 Claims, 5 Drawing Sheets

(51) Int. Cl.
*H03K 17/16* (2006.01)
*H02M 1/08* (2006.01)

(56) References Cited

U.S. PATENT DOCUMENTS

2016/0233789 A1* 8/2016 Onishi ............... H03K 17/0828
2018/0097451 A1* 4/2018 Morin .................... H02M 7/06

* cited by examiner

DEVICE AND METHOD FOR CONTROLLING SWITCHING

TECHNICAL FIELD

The present invention relates generally to a method and device for controlling the switching of a first and a second power semiconductor switches providing current to a load in a half bridge configuration.

BACKGROUND ART

Today, the switching frequency of power converters is increasing. Wide-band gap devices like for example e.g. GaN and SiC provide faster switching capabilities than classical technologies.

The switching of power semiconductor devices constituting for example a half-bridge needs to be performed with great time precision.

Indeed, in a half-bridge configuration, if one power semiconductor switch turns ON before the other one is turned OFF i.e. cross-conduction, a high current through the switches creates a high level of power losses in at least one of the switches.

One possible way to avoid cross-conduction is to introduce a dead-time i.e. to delay the turn-ON of a switch with respect to the turn-OFF of the other switch such that both switches are OFF for a short time interval. The dead-time is typically defined based on a worst-case scenario.

During the dead-time, the current flows through one of the power semiconductor switches in reverse conduction mode, and may create a high level of losses in the power semiconductor switch, or may damage the power semiconductor switch.

In addition, dead-time may decrease the controllability of the half-bridge by modifying the apparent duty-cycle.

Another problem associated with the immaturity of the Wide-band gap devices technology is the MOSFET degradation through conduction of the body diode.

Yet another problem is the introduction of low-frequency harmonics in a pulse-width modulation scheme, normally countered by expensive current sensors to compensate for the dead-time.

The present invention aims to prevent both cross-conduction and dead-time during the switching of power semiconductor switches like for example, wide-band gap devices, silicon devices, MOSFETs or IGBTs, of a half-bridge configuration.

SUMMARY OF INVENTION

The present invention concerns a device for controlling the switching of a first and a second power semiconductor switches providing current to a load in a half bridge configuration, characterized in that the device comprises:
  means for obtaining a first current value through the first switch or the load just before the switching of the first switch from conducting to non-conducting state,
  means for obtaining a first current value through the first switch or the load just before the switching of the first switch from conducting to non-conducting state,
  means for limiting the current through the second switch during the switching of the second switch from non-conducting to conduction state using the obtained first current value, by modifying the gate signal of the second switch,
  means for obtaining a second current value through the second switch or the load just before the switching of the second switch from conducting to non-conducting state,
  means for limiting the current through the first switch during the switching of the first switch from non-conducting to conduction state using the obtained second current value by modifying the gate signal of the first switch.

The present invention concerns also a method for controlling the switching of a first and a second power semiconductor switches providing current to a load in a half bridge configuration, characterized in that the method comprises the steps of:
  obtaining a first current value through the first switch or the load just before the switching of the first switch from conducting to non-conducting state,
  limiting the current through the second switch during the switching of the second switch from non-conducting to conduction state using the obtained first current value, by modifying the gate signal of the second switch,
  obtaining a second current value through the second switch or the load just before the switching of the second switch from conducting to non-conducting state,
  limiting the current through the first switch during the switching of the first switch from non-conducting to conduction state using the obtained second current value by modifying the gate signal of the first switch.

Thus, cross-conduction currents can be prevented, for example during the turn-ON of the second switch and the turn-OFF of the first switch and during the turn-ON of the first switch and the turn-OFF of the second switch.

According to a particular feature, the means for limiting the current through the first switch are composed of a reference module that provides a first reference value derived from the second current value, current sensing means for sensing the current value through the first switch during the conducting of the first switch, a first comparison and combination module that combines the first reference value and the sensed current value through the first switch during the switching of the first switch, an enabling module that enables the feedback during the commutation, and a combination and amplification module that subtracts the output of the first comparison and combination module to the gate signal provided to the first switch.

Thus, the difference between the first reference value and the current value through the first switch is fed back to the gate voltage of the first switch Sa during the commutation, and the current through the first switch Sa is limited to a value defined by the first reference value.

According to a particular feature, the means for limiting the current through the second switch are composed of a reference module that provides a reference value derived from the first current value, current sensing means for sensing the current value through the second switch during the conducting of the second switch, a second comparison and combination module that combines the second reference value and the sensed current value through the second switch during the conducting of the second switch and a combination and amplification module that subtracts the output of the second comparison and combination module to the gate signal provided to the second switch.

Thus, the difference between the second reference value and the current value through the second switch is fed back to the gate voltage of the second switch Sb, and the current through the second switch Sb is limited to a value defined by the second reference value.

According to a particular feature, the first reference value is an image of the current through the power semiconductor Sb at a time before the power semiconductor Sb switches from ON to OFF states which is comprised between 0.1% and 5% of the total duration of the conducting state of the power semiconductor Sb and the second reference value is an image of the current through the power semiconductor Sa at a time before the power semiconductor Sa switches from ON to OFF states which is comprised between 0.1% and 5% of the total duration of the conducting state of the power semiconductor Sa.

Thus, the first reference value is an image of the load current during the turn-ON of the first switch, and the second reference value is an image of the load current during the turn-ON of the second switch.

By obtaining the first and second current values through the first and second switches just before they switch from conducting to non-conducting state, the reference values have a high accuracy.

For example, during the conduction of the first switch, the current in the load may increase, for example from 10 A to 20 A with a rate of one Ampere per microsecond. If the second reference value is an image of the current at a time 0.1% before turn OFF of Sa, the second reference value is generated accurately based on a correct estimation of the load current during the turn-ON of Sb (10 ns, 10 mA error). If first and second currents are obtained earlier than 5% of the total duration of the conducting state of the power semiconductor Sa, for example 10%, reference values are not accurate (1 µs, 1 A error).

According to a particular feature, the first current value is obtained by sensing the current value through the first switch or the load just before the switching of the first switch from conducting to non-conducting state and the second current value is obtained by sensing the current value through the second switch or the load just before the switching of the second switch from conducting to non-conducting state.

Thus, the first and second current values can be obtained with current sensors.

According to a particular feature, the first reference value is derived from the second current value using a first sample and hold device and the second reference value is derived from the first current value using a second sample and hold device.

Thus, the first and second reference values are generated with simple and low-cost devices. A low processing effort is required.

According to a particular feature, the first current value is obtained by sensing at least two current values through the second switch or the load during the conducting of the second switch and the second current value is obtained by sensing at least two current values through the first switch or the load during the conducting of the first switch.

Thus, the first current value and the second current value are more accurately representing the current value in the load during the turn-ON of Sb and Sa.

According to a particular feature, the first reference value is derived from the second current value obtained by sensing at least two current values and the second reference value is derived from the first current value obtained by sensing at least two current values.

Thus, the first and second reference values are estimated with greater accuracy.

BRIEF DESCRIPTION OF DRAWINGS

The characteristics of the invention will emerge more clearly from a reading of the following description of example embodiments, the said description being produced with reference to the accompanying drawings, among which.

DESCRIPTION OF EMBODIMENTS

Figure 1:
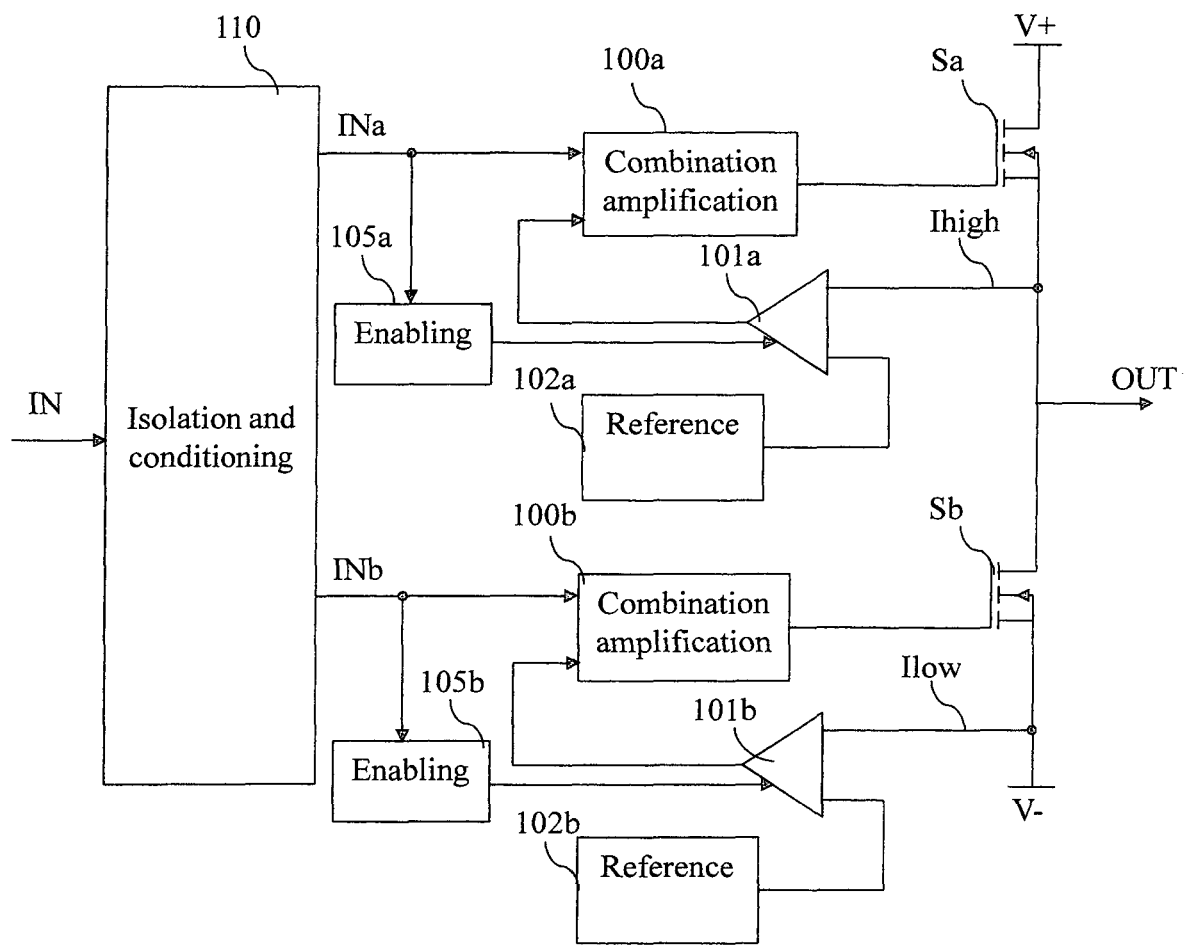
FIG. 1 represents an example of an architecture of a system for controlling the switching of power semiconductors of a half bridge according to the present invention.

FIG. 1 represents an example of an architecture of a system for controlling the switching of power semiconductors of a half bridge according to the present invention.

The system for controlling the switching of power semiconductors of a half bridge comprises one isolation and conditioning module 110, two combination and amplification modules 100a and 100b, two comparison and combination modules 101a and 101b, two activation modules 105a and 105b and two reference modules 102a and 102b that control the switching of power semiconductors Sa and Sb.

The isolation and conditioning module 110 receives one input signal IN, for example, a pulse width modulated signal. The isolation and conditioning module 110 generates two signals INa and INb. The isolation and conditioning module 110 isolates the signals INa and/or INb from the input signal IN or may performs a level-shift of the input signal IN.

The isolation and conditioning module may perform a conditioning of the input signal IN like for example an inversion of the input signal IN in order to provide the signal INa and the complementary signal INb. Thus, a single input voltage IN is necessary, and no dead-time needs to be generated externally.

The combination and amplification module 100a combines the input signal INa and an error signal provided by the comparison and combination module 101a in order to provide an amplified signal to be provided to a switch Sa of the half bridge. Examples of the combination module 100a will be disclosed in reference to FIGS. 2 to 5.

The objective of the amplification is to generate a signal with sufficient strength to drive the power semiconductor switch Sa at a high speed.

The two signals, i.e. the input and the amplified error signals, need to be combined and amplified to drive the gate of the power semiconductor switch Sa.

The combination of the input and error signals can be implemented in different ways.

The comparison and combination module 101a combines an image Ihigh of the current through the switch Sa to a first reference value provided by the reference module 102a.

The image Ihigh is provided by a current sensor not shown in FIG. 1. The current sensor captures the current through the power semiconductor Sa when the power semiconductor Sa is conducting. The measure of the current through the power semiconductor switch Sa is realized with a high-frequency current measuring means. Examples of implementation include for example current transformers, shunt resistors, current mirrors and Rogowski coils that may operate between 10 MHz and 10 GHz.

The image Ilow may be provided indirectly by current sensors through the power semiconductor Sb and the load current Iload: Ilow=Ihigh−Iload.

The comparison and combination module 101a generates a signal that is proportional to the error between the measured current and a first reference value. The comparison and combination module 101a may be able to detect if an over-current is occurring during the turn-ON of the power semiconductor switch.

The comparison and combination module 101a typically makes at least one mathematical operation (e.g. difference, addition) to combine the two input signals, and may apply a constant offset, or a gain. The comparison and combination module 101a does not only define a boolean operator that provides a discrete output signal. For example, the comparison and combination module 101a may be a differential operational amplifier. The output of the differential operational amplifier is a signal proportional to the difference between the scaled image of the measured current value and a first reference value provided by the reference module 102a value according to the control law:

$$V\text{gate}a = Ka^{*}(\text{abs}(Ithh) - Ihigh).$$

Ithh is the first reference value, Vgatea is the voltage at the output of the comparison and combination module 101a and Ka is the gain of the differential operational amplifier. Ka is such that the gain of the total feedback loop is larger than the transconductance of the power semiconductor switch, for example 10 to 50 times larger, but sufficiently low to maintain a stable transition.

Though a simple gain term suffices to perform the control function, integral or differentiating terms can be added in the control loop to compensate for parasitics in the gate circuit.

The combination may be completed by at least one additional stage. Examples of stages are an inverter stage, or a gain stage.

The comparison and combination module 101a is enabled during the commutation by the activation module 105a.

The activation module 105a detects the rising edge of the signal INa and sends an activation signal to the comparison and combination module 105. After the commutation is finished, for example after a time comprised between 10 ns and 1 μs, the activation module 105a sends a disabling signal to the comparison and combination module 101a.

The reference module 102a provides the first reference value Ithh to the comparison and combination module 101a. Examples of the reference module 102a will be disclosed in reference to FIGS. 6a and 7.

The first reference value Ithh defines the maximum absolute level of current that is expected through the power semiconductor switch Sa during its turn-ON. The first reference value Ithh is not a fixed value, but a value that is modified/updated dynamically during the operation of the half bridge.

According to a particular mode of realization of the present invention, the first reference value Ithh is an image of the current through the power semiconductor Sb just before the power semiconductor Sb switches from ON to OFF states. More particularly, the first reference value Ithh is an image of the current through the power semiconductor Sb at a time before the power semiconductor Sb switches from ON to OFF states which is comprised between 0.1% and 5% of the total duration of the conducting state of the power semiconductor Sb in which the current is measured.

The combination and amplification module 100b combines the input signal INb and an error signal provided by the comparison and combination module 101b in order to provide an amplified signal to a switch Sb of the half bridge. Examples of the combination module 100a will be disclosed with reference to FIGS. 2 to 5.

The purpose of the amplification is to generate a signal with sufficient strength to drive the power semiconductor switch Sb at a high speed.

The two signals, i.e. the input and the amplified error signals, need to be combined and amplified to drive the gate of the power semiconductor switch Sb.

The combination of the input and error signals can be implemented in different ways.

The comparison and combination module 101b combines an image Ilow of the current provided by the switch Sb to a load connected to the output of the half bridge to a second reference provided by the reference module 102b.

The image Ilow is provided by a current sensor not shown in FIG. 1.

The current sensor captures the current through the power semiconductor Sa when the power semiconductor Sa is conducting. The measure of the current through the power semiconductor switch Sb is realized with a high-frequency current measuring means. Examples of implementation include for example current transformers, shunt resistors, current mirrors and Rogowski coils that may operate between 10 MHz and 10 GHz.

The image Ihigh may be provided indirectly by current sensors through the power semiconductor Sb and the load current Iload: Ihigh=Ilow+Iload.

The comparison and combination module 101b typically makes at least one mathematical operation (e.g. difference, addition) in order to combine the two input signals and may apply a constant offset or a gain. Thus, the comparison and combination module 101b does not only define a boolean operator that provides a discrete output signal. For example, the comparison and combination module 101b generates a signal that is proportional to the error between the measured current and the second reference value. The comparison and combination module 101b may be able to detect if an over-current is occurring during the turn-ON of the power semiconductor switch Sb.

The comparison and combination module 101b may be a differential operational amplifier. The output of this differential operational amplifier is a signal proportional to the difference between the scaled image of the measured current value and the second reference value provided by the reference module 102b value according to the control law:

$$Vgateb=Kb*(abs(Ithl)-Ilow).$$

Ithl is the second reference value, Vgateb is the voltage at the output of the comparison and combination module 101b and Kb is the gain of the differential operational amplifier. Kb is such that the gain of the total feedback loop is larger than the transconductance of the power semiconductor switch, for example 10 to 50 times larger, but sufficiently low to maintain stable transition. Though a simple gain term suffices to perform the control function, integral or differentiating terms can be added in the control loop to compensate for parasitics in the gate circuit.

The combination may be completed by at least one additional stage. Examples of stages are an inverter stage, or a gain stage.

The comparison and combination module 101b is enabled during the commutation by the activation module 105b.

The activation module 105b detects the rising edge of the signal INb and sends an enabling signal to the comparison and combination module 101b. After the commutation is completed, for example after a time comprised between 10 ns and 1 μs, the activation module 105b sends a disabling signal to the comparison and combination module 101b.

The reference module 102b provides the reference value Ithl to the comparison and combination module 101b. Examples of the reference module 102b will be disclosed with reference to FIGS. 6b and 7.

The second reference value Ithl defines the maximum absolute level of current that is expected through the power semiconductor switch Sb during its turn-ON. The reference value Ithl is not a fixed value, but a value that is modified/updated dynamically during the operation of the half bridge.

According to a particular mode of realization of the present invention, the second reference value Ithl is an image of the current through the power semiconductor Sa just before the power semiconductor Sa switches from ON to OFF states. More particularly, the second reference value Ithl is an image of the current through the power semiconductor Sa at a time before the power semiconductor Sa switches from ON to OFF states which is comprised between 0.51% and 5% of the total duration of the conducting state of the power semiconductor Sa in which the current is measured.

The drain of the power semiconductor switch Sa is connected to a positive power supply V+, the source of the power semiconductor switch Sa is connected to the drain of the power semiconductor switch Sb and to the output OUT of the half bridge.

The source of the power semiconductor switch Sb is connected to a negative power supply V−.

The semiconductors Sa and Sb may be Silicon, Silicon Carbide or Gallium Nitride devices. Examples are Field Effect Transistors (FETs) or IGBTs. The semiconductors are typically reverse conductive, either intrinsically (e.g. body-diode) or by the addition of an external anti-parallel diode. In the example of FIG. 1, the diodes are not represented but are implicit.

Figure 2:
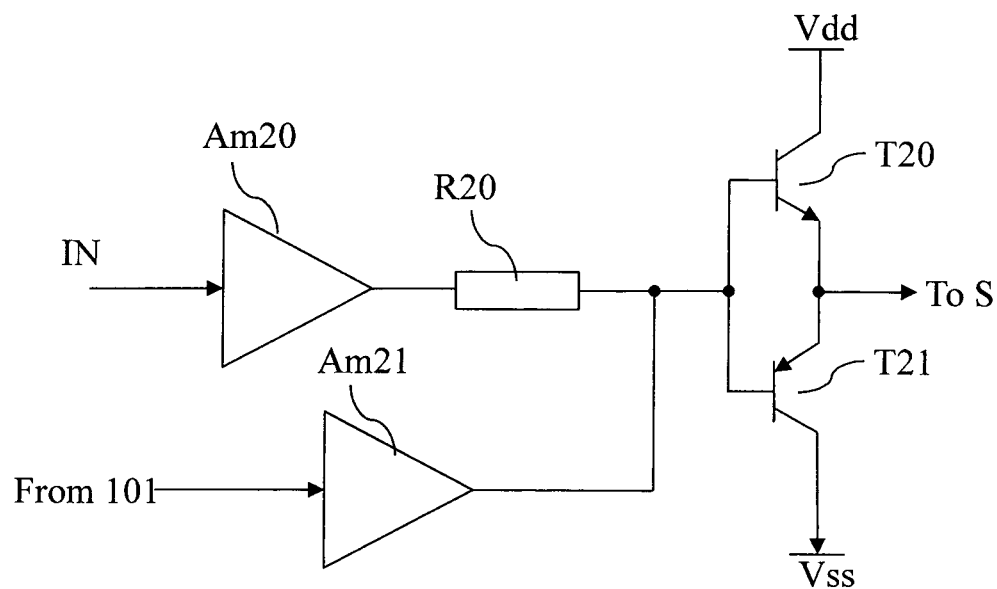
FIG. 2 represents a first example of the architecture of combination and amplification modules of the system for controlling the switching of power semiconductors of the half bridge according to the present invention.

FIG. 2 represents a first example of the architecture of combination and amplification modules of the system for controlling the switching of power semiconductors of the half bridge according to the present invention.

The combination and amplication modules 100a and 100b are identical.

In FIG. 2, the combination is performed by a resistor R20.

The input signal IN is preamplified by the amplifier Am20. The output of the amplifier Am20 is connected to a first terminal of a resistor R20 whose value is larger than the output impedance of the amplifier Am21. A second terminal of the resistor 20 is connected to the bases of the transistors T20 and T21.

Alternatively, the combination is performed without R20 by the output impedance RoutAm20 of the amplifier Am20 and the output impedance RoutAm21 of the amplifier Am21. For example, the amplifier Am20 has an output impedance of 10 Ohms, and the amplifier Am21 may have an output impedance of 0.1 Ohms.

In any case, the relation R20+RoutAm20>>RoutAm21.

The error signal provided by the comparison and combination module 101 is preamplified by the amplifier Am21. The output of the amplifier Am21 is connected to the bases of the transistors T20 and T21 which are in a push-pull configuration. The collector of the NPN transistor T20 is connected to a positive power supply Vdd. The emitter of the transistor T20 is connected to the emitter of the PNP transistor T21 and is the output of the combination and amplication module 100 which is connected to transistor S.

The collector of the transistor T21 is connected to the negative power supply Vss.

Figure 3:
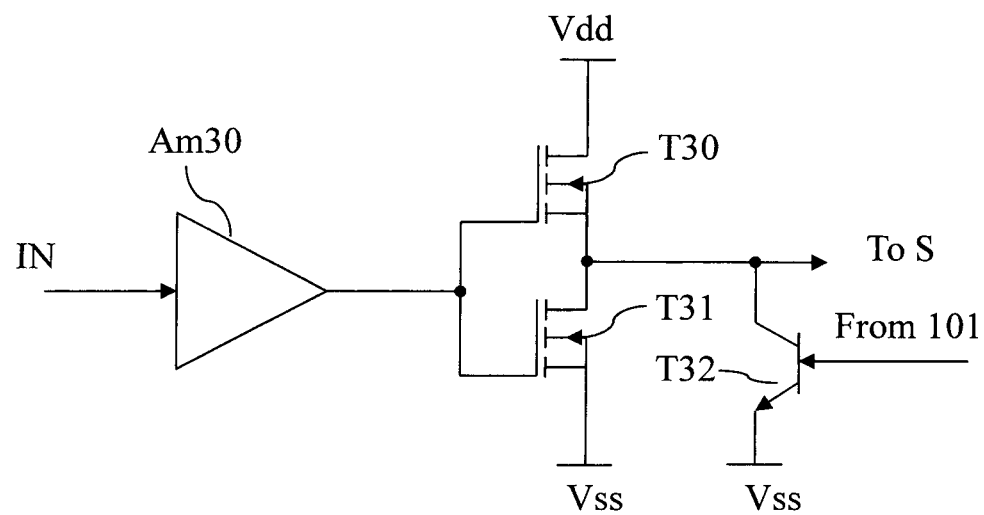
FIG. 3 represents a second example of the architecture of combination and amplification modules of the system for controlling the switching of power semiconductors of the half bridge according to the present invention.

FIG. 3 represents a second example of the architecture of combination and amplification modules of the system for controlling the switching of power semiconductors of the half bridge according to the present invention.

The combination and amplication modules 100a and 100b are identical.

The input signal IN is preamplified by the amplifier Am30. The output of the amplifier Am20 is connected to the gates of the type P MOSFET transistors T30 and T31.

The error signal provided by the comparison and combination module 101 is provided to the base of a transistor T32 in order to be amplified by the NPN bipolar transistor T32. The emitter of the transistor T32 is connected to the low gate power supply Vss.

The collector of the transistor T32 is connected to the drain of the transistors T30 and T31.

The source of the PMOS transistor T30 is connected to the high gate power supply Vdd. The drain of the transistor T30 is connected to the drain of the transistor T31 and is the output of the combination and amplication module 100 which is connected to the transistor S.

The source of the transistor T31 is connected to the negative power supply Vss.

Figure 4:
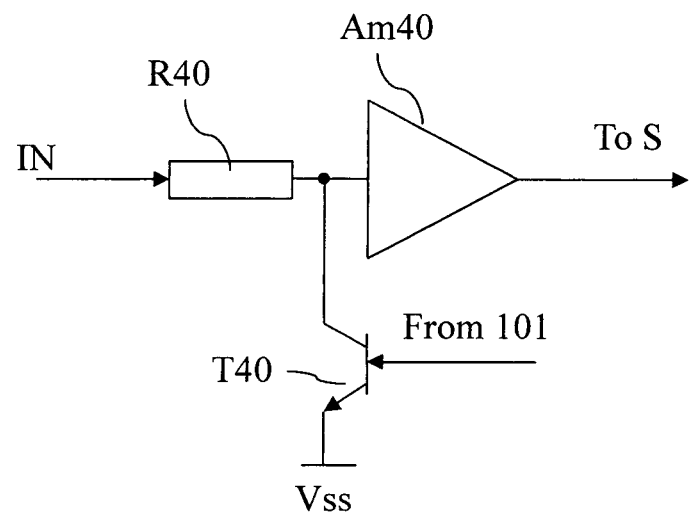
FIG. 4 represents a third example of the architecture of combination and amplification modules of the system for controlling the switching of power semiconductors of the half bridge according to the present invention.

FIG. 4 represents a third example of the architecture of combination and amplification modules of the system for controlling the switching of power semiconductors of the half bridge according to the present invention.

The combination and amplication modules 100a and 100b are identical.

The input signal IN is connected to a first terminal of a resistor R40 typically of 10Ω to 100Ω. The second terminal of the resistor R40 is connected to the input of an amplifier Am40 and to the collector of a NPN bipolar transistor T40.

The error signal provided by the comparison and combination module 101 is provided to the base of a transistor T40 in order to be preamplified by the NPN bipolar transistor T40. The emitter of the transistor T40 is connected to the low gate power supply Vss.

The output of the amplifier T40 is the output of the combination and amplication module 100 which is connected to transistor S.

Figure 5:
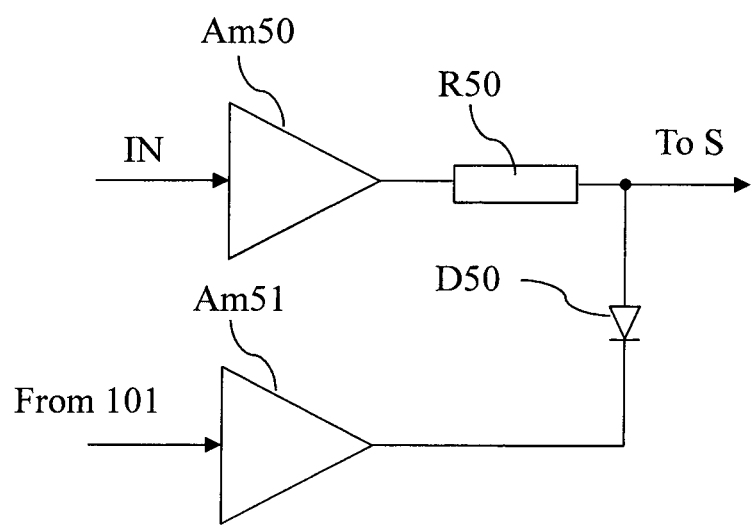
FIG. 5 represents a fourth example of the architecture of combination and amplification modules of the system for controlling the switching of power semiconductors of the half bridge according to the present invention.

FIG. 5 represents a fourth example of the architecture of combination and amplification modules of the system for controlling the switching of power semiconductors of the half bridge according to the present invention.

The combination and amplification modules 100a and 100b are identical.

In FIG. 5, the combination is performed by the resistor R50 and the diode D50.

The input signal IN is preamplified by the amplifier Am50. The output of the amplifier Am20 is connected to a first terminal of a resistor R50. A second terminal of the resistor R50 is connected to the anode of a diode D50 and is the output of the combination and amplication module 100 which is connected to the transistor S.

The combination may be performed without R50 by the output impedance of the amplifiers Am50 and Am51. For example, the amplifier Am50 has an output impedance of 10 Ohms, and the amplifier Am51 may have an output impedance of 0.1 Ohms.

In any case, the relation R50+RoutAm50>>RoutAm51.

The cathode of the diode D50 is connected to the output of the amplifier Am51. Diode D50 acts as a switch, i.e. the amplifier Am51 can only pull down the gate voltage.

The error signal provided by the comparison and combination module 101 is amplified by the amplifier Am21.

Figure 6A:
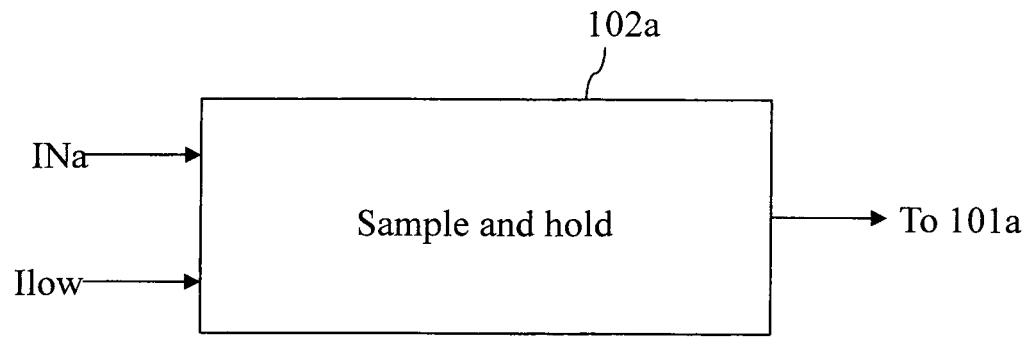
FIG. 6a represents a first example of the architecture of a first reference module of the system for controlling the switching of power semiconductors of the half bridge according to the present invention.

FIG. 6a represents a first example of the architecture of a first reference module of the system for controlling the switching of power semiconductors of the half bridge according to the present invention.

The first reference value Ithh defines the maximum absolute level of current that is expected through the power semiconductor switch Sa only during its turn-ON. The reference value is not a fixed value, but a value that is modified/updated dynamically during the operation of the half bridge.

The first reference value Ithh is defined as an absolute of the scaled value of the current in the other power semiconductor switch Sb right before its turn-OFF, sampled right before the switching event.

According to the first example of realization, the first reference value Ithh is an image of the current through the power semiconductor Sb just before the power semiconductor Sb switches from ON to OFF states. More particularly, the first reference value Ithh is an image of the current through the power semiconductor Sb at a time before the power semiconductor Sb switches from ON to OFF states which is comprised between 0.1% to 5% of the total duration of the conducting state of the power semiconductor Sb in which the current is measured.

The means to define the first reference value can be implemented with a sample and hold device. The input signal of the sample and hold device is for example a scaled value of the current through the power semiconductor switch Sb. The clock signal of the sample and hold device is the rising edge of the signal INa or falling edge of INb.

It has to be noted here that the sampling time of the reference module 102a with the input INa is lower than the propagation time in the combination and amplication module 100a between the input INa and the signal to Sa.

Figure 6B:
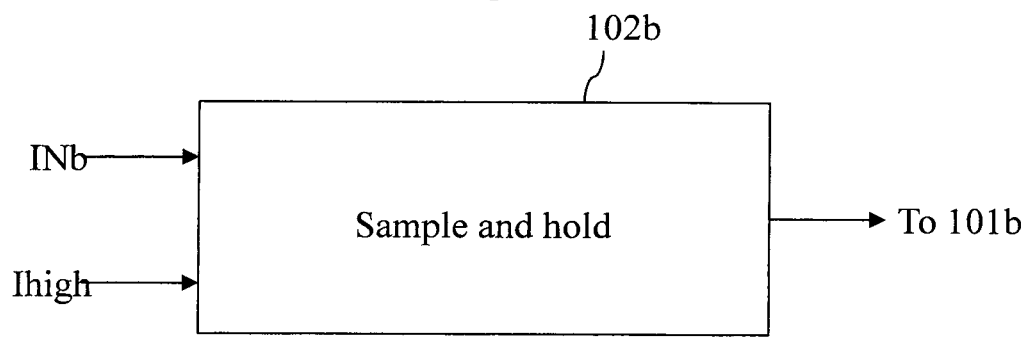
FIG. 6b represents a first example of realization of the architecture of a second reference module of the system for controlling the switching of power semiconductors of the half bridge according to the present invention.

FIG. 6b represents a first example of the architecture of a second reference module of the system for controlling the switching of power semiconductors of the half bridge according to the present invention.

The second reference value Ithl is defined as an absolute of the scaled value of the current in the other power semiconductor switch Sa right before its turn-OFF, sampled right before the switching event. The means to define the second reference value can be implemented with a sample and hold device. The input signal of the sample and hold device is for example a scaled value of the current through the power semiconductor switch Sa. The clock signal of the sample and hold device is the rising edge of the signal INb (or falling edge of INa).

More particularly, the second reference value Ithl is an image of the current through the power semiconductor Sa at a time before the power semiconductor Sa switches from ON to OFF state which is comprised between 0.1% to 5% of the total duration of the conducting state of the power semiconductor Sa in which the current is measured.

It has to be noted here that the sampling time of the reference module 102b with the input INa is lower than the propagation time in the combination and amplication module 100a between the input INa and the signal to Sa.

Figure 7:
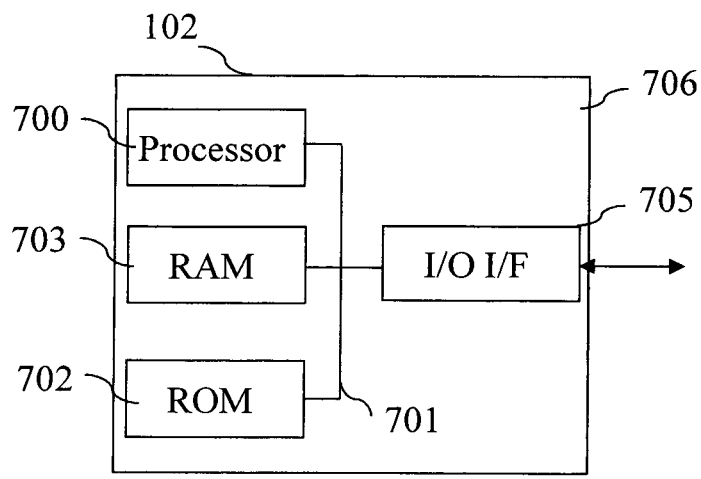
FIG. 7 represents a second example of realization of the architecture of the reference modules of the system for controlling the switching of power semiconductors of the half bridge according to the present invention.

FIG. 7 represents a second example of the architecture of the reference modules of the system for controlling the switching of power semiconductors of the half bridge according to the present invention.

In the example of FIG. 7, the reference modules are combined in a single module.

The reference module 102 has, for example, an architecture based on components connected together by a bus 701 and a processor 700 controlled by a program as disclosed in FIG. 8.

The bus 701 links the processor 700 to a read only memory ROM 702, a random access memory RAM 703 and an input output I/O IF interface 705.

Figure 8A:
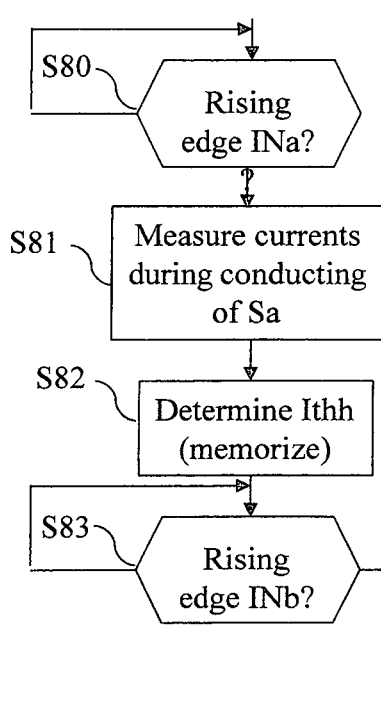
FIG. 8a is an example of an algorithm executed by the reference module for determining and transferring the first reference value according to the second example of realization.
Figure 8B:
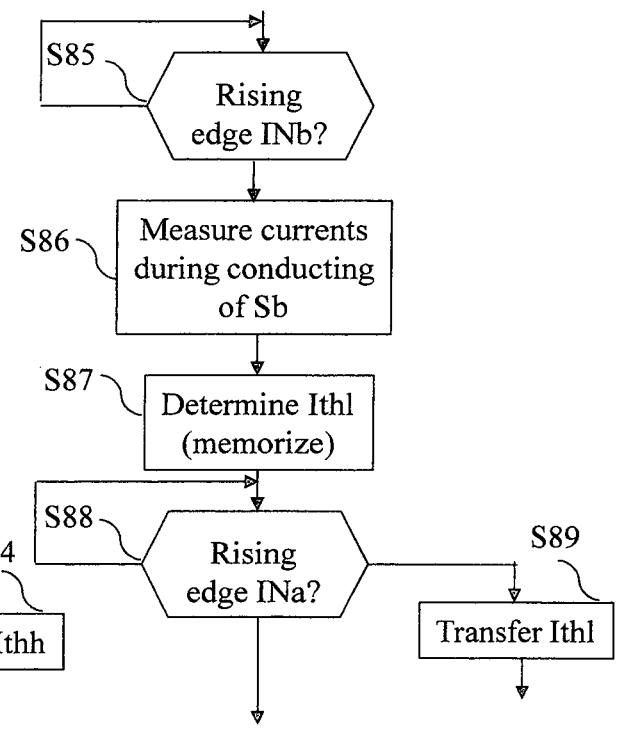
FIG. 8b is an example of an algorithm executed by the reference module for determining and transferring the second reference value according to the second example of realization.

The memory 703 contains registers intended to receive variables and the instructions of the program related to the algorithm as disclosed in FIGS. 8a and 8b.

The processor 700 receives through the input output I/O IF 705, at least one sensed current Ihigh and/or Ilow or the load current, the input signals INa and INb, transfers the first reference value to the comparison and combination module 101a and transfers the second reference value to the comparison and combination module 101b.

The read-only memory, or possibly a Flash memory 702, contains instructions of the program related to the algorithm as disclosed in FIGS. 8a and 8b, when the reference module 102 is powered on, to the random access memory 703.

The reference module 102 may be implemented in software by the execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the reference module 102 includes circuitry, or a device including circuitry, causing the reference module 102 to perform the program related to the algorithm as disclosed in FIG. 8. The processor 800 may generate the first and second reference values based on information available on the operating conditions of the half bridge (e.g. voltage, frequency, current values). The processor 800 may estimate the value of the current in the load during the turn-ON of the respective power semiconductor switches and generates a target value accordingly.

FIG. 8*a* is an example of an algorithm executed by the reference module for determining and transferring the first reference value according to the second example of realization.

The present algorithm is disclosed in an example where it is executed by the processor 700.

At next step S80, the processor 700 checks if a rising edge of INa occurs.

If a rising edge of INa occurs, the processor 700 moves to step S81. Otherwise, the processor 700 returns to step S80.

At step S81, the processor 700 obtains at least two values of the current Ihigh during the conducting of the switch Sa. For example, a first current is obtained during the first quarter of conduction time of the switch Sa and a second current is obtained during the second quarter of conduction time of the switch Sa.

At step S82, the processor 700 determines, from the first and second values of the current Ihigh, the current through the power semiconductor Sb just before the power semiconductor Sa switches from ON to OFF states. More particularly, the processor 700 determines the first reference value Ithh as an image of the current through the power semiconductor Sb at a time close to the moment the power semiconductor Sb switches from ON to OFF state which is comprised between 0.1% to 5% of the total duration of the conducting state of the power semiconductor Sa in which the current values are measured.

The processor 700 memorizes the determined, first reference value Ithh.

At next step S83, the processor 700 checks if a rising edge of INb occurs.

If a rising edge of INb occurs, the processor 700 moves to to step S83. Otherwise, the processor 700 returns to step S82.

At step S84, the processor 700 transfers the first reference value Ithh to the comparison and combination module 101*b* and returns to step S80.

It has to be noted here that the transferred first reference value Ithh may be a value determined at a previous iteration of the present algorithm.

FIG. 8*b* is an example of an algorithm executed by the reference module for determining and transferring the second reference value according to the second example of realization.

The present algorithm is disclosed in an example where it is executed by the processor 700.

At next step S85, the processor 700 checks if a rising edge of INb occurs.

If a rising edge of INb occurs, the processor 700 moves to step S86. Otherwise, the processor 700 returns to step S85.

At step S86, the processor 700 obtains at least two values of the current Ilow during the conducting of the switch Sb. For example, a first current is obtained during the first quarter of conduction time of the switch Sb and a second current is obtained during the second quarter of conduction time of the switch Sb.

At step S87, the processor 700 determines, from the first and second values of the current Ihigh, the current through the power semiconductor Sa just before the power semiconductor Sa switches from ON to OFF state. More particularly, the processor 700 determines the second reference value Ithl as an image of the current through the power semiconductor Sa at a time close to the moment the power semiconductor Sa switches from ON to OFF state which is comprised between 0.1% to 5% of the total duration of the conducting state of the power semiconductor Sb in which the current values are measured.

The processor 700 memorizes the determined second reference value Ithl.

At next step S88, the processor 700 checks if a rising edge of INa occurs.

If a rising edge of INa occurs, the processor 700 moves to step S89. Otherwise, the processor 700 returns to step S88.

At step S89, the processor 700 transfers the second reference value Ithl to the comparison and combination module 101*a* and returns to step S85.

It has to be noted here that the transferred second reference value Ithl may be a value determined at a previous iteration of the present algorithm.

Naturally, many modifications can be made to the embodiments of the invention described above without departing from the scope of the present invention.

The invention claimed is:

1. Device for controlling the switching of a first and a second power semiconductor switches providing current to a load in a half bridge configuration, characterized in that the device comprises:

first obtainer to obtain a first current value through the first switch or the load just before the switching of the first switch from conducting to non-conducting state, first limiter to limit the current through the second switch during the switching of the second switch from non-conducting to conducting state using a reference value derived from the obtained first current value, by modifying the gate signal of the second switch, second obtainer to obtain a second current value through the second switch or the load just before the switching of the second switch from conducting to non-conducting state, second limiter to limit the current through the first switch during the switching of the first switch from non-conducting to conducting state using another reference value derived from the obtained second current vain; by modifying the gate signal of the first switch.

2. Device according to claim 1, wherein the second limiter is composed of a reference module that provides the another reference value derived from the second current value, current sensor to sense the current value through the first switch during the conducting of the first switch, a first comparison and combination module that combines the another reference value and the sensed current value through the first switch during the switching of the first switch and a combination and amplification module that subtracts the output of the first comparison and combination module to the gate signal provided to the first switch.

3. Device according to claim 1, wherein the first limiter is composed of a reference module that provides the reference value derived from the first current value, current sensor to sense the current value through the second switch during the conducting of the second switch, a comparison and combination module that combines the reference value and the sensed current value through the second switch during the switching of the second switch and a combination and amplification module that subtracts the output of the second comparison and combination module to the gate signal provided to the second switch.

4. Device according to claim 2, wherein the another reference value is an image of the current through the second power semiconductor switch at a time before the second power semiconductor switch switches from ON to OFF state which is comprised between 0.1% to 5% of the total duration of the conducting state of the second power semiconductor switch and the reference value is an image of the current through the first power semiconductor switch at a time before the first power semiconductor switch switches from ON to OFF states which is comprised between 0.1% to 5% of the total duration of the conducting state of the first power semiconductor switch.

5. Device according to claim 4, wherein the first current value is obtained by sensing the current value through the first switch or the load just before the switching of the first switch from conducting to non-conducting state and the second current value is obtained by sensing the current value through the second switch or the load just before the switching of the second switch from conducting to non-conducting state.

6. Device according to claim 5, wherein the another reference value is derived from the second current value using a first sample and hold device and the reference value is derived from the first current value using a second sample and hold device.

7. Device according to claim 4, wherein the first current value is obtained by sensing at least two current values through the second switch or the load during the conducting of the second switch and the second current value is obtained by sensing at least two current values through the first switch or the load during the conducting of the first switch.

8. Device according to claim 4, wherein the another reference value is derived from the second current value obtained by sensing at least two current values and the reference value is derived from the first current value obtained by sensing at least two current values.

9. Method for controlling the switching of a first and a second power semiconductor switches providing current to a load in a half bridge configuration, characterized in that the method comprises:

obtaining a first current value through the first switch or the load just before the switching of the first switch from conducting to non-conducting state, limiting the current through the second switch during the switching of the second switch from non-conducting to conducting state using a reference value derived from the obtained first current value, by modifying the gate signal of the second switch, obtaining a second current value through the second switch or the load just before the switching of the second switch from conducting to non-conducting state, limiting the current through the first switch during the switching of the first switch from non-conducting to conducting state using another reference value derived from the obtained second current value, by modifying the gate signal of the first switch.

* * * * *